United States Patent

Deweerdt et al.

[11] Patent Number: 6,037,779
[45] Date of Patent: Mar. 14, 2000

[54] BUS ISOLATION/DIAGNOSTIC TOOL

[75] Inventors: Thomas E. Deweerdt, Ortonville; Anthony M. Abraham, Houghton, both of Mich.

[73] Assignee: Chrysler Corporation, Auburn Hills, Mich.

[21] Appl. No.: 08/948,642

[22] Filed: Oct. 10, 1997

Related U.S. Application Data

[60] Provisional application No. 60/059,144, Sep. 17, 1997.

[51] Int. Cl.⁷ .................................................. G01R 31/00
[52] U.S. Cl. ........................................... 324/503; 324/402
[58] Field of Search .................................... 324/503, 402, 324/384, 466, 539

[56] References Cited

U.S. PATENT DOCUMENTS

| | | | |
|---|---|---|---|
| 3,646,438 | 2/1972 | Staff | 324/73 R |
| 4,002,972 | 1/1977 | Konrad et al. | 324/73 R |
| 4,207,610 | 6/1980 | Gordon | 364/580 |
| 4,220,912 | 9/1980 | Williams | 324/51 |
| 4,271,388 | 6/1981 | Schaling | 324/51 |
| 4,617,510 | 10/1986 | Deicke et al. | 324/51 |
| 4,764,727 | 8/1988 | McConchie, Sr. | 324/503 |
| 4,884,033 | 11/1989 | McConchie, Sr. | 324/503 |
| 5,066,919 | 11/1991 | Klassen et al. | 324/538 |
| 5,264,796 | 11/1993 | Klassen et al. | 324/503 |
| 5,268,644 | 12/1993 | Klassen et al. | 324/503 |
| 5,278,508 | 1/1994 | Bowman | 324/503 |
| 5,287,523 | 2/1994 | Allison et al. | 395/725 |
| 5,311,138 | 5/1994 | Ott et al. | 324/503 |
| 5,315,252 | 5/1994 | Puetz et al. | 324/503 |
| 5,365,438 | 11/1994 | Mitchell | 324/503 |
| 5,491,418 | 2/1996 | Alfaro et al. | 324/402 |
| 5,528,754 | 6/1996 | Okamoto | 395/183.19 |
| 5,530,360 | 6/1996 | Kerchaert | 324/503 |
| 5,534,848 | 7/1996 | Steele et al. | 340/517 |
| 5,854,555 | 12/1998 | Sasaki | 324/503 |

FOREIGN PATENT DOCUMENTS

| | | | |
|---|---|---|---|
| 0039122 | 11/1981 | European Pat. Off. | 324/503 |

*Primary Examiner*—Josie Ballato
*Assistant Examiner*—T. R. Sundaram
*Attorney, Agent, or Firm*—Roland A. Fuller, III

[57] ABSTRACT

A communication bus test tool for motor vehicles having a plurality of electronic modules connected to a common communication bus in a body controller by a wiring harness. The wiring harness has an individual bus signal wire for the bus signal for each electronic module and at least one connector for connecting to a corresponding connector of the body controller. The wiring harness's connector has an individual terminal connected to each individual bus signal wire and the body controller's connector has terminals corresponding to the wiring harness' connector terminals. The bus test tool has a first connector for connecting to the wiring harness's connector with individual terminals corresponding to the individual terminals in the wiring harness connector including individual bus terminals corresponding to the terminals in the wiring harness connector connected to the bus signal wires. The bus test tool has a second connector for connecting to the body controller's connector with individual terminals corresponding to the individual terminals in the bus test tool's first connector including individual bus terminals corresponding to the individual bus terminals in the first connector. Circuits are coupled between the bus test tool's first and second connectors for selectively connecting and disconnecting the bus terminals in the first connector to the corresponding bus terminals connections in the second connector to permit bus signals from each electronic module to be selectively isolated from the common bus in the body controller. The bus test tool also includes circuits for detecting whether the bus signal from an electronic module is above a specified operating range, within the range, or below the range, and indicating the results of the detection

7 Claims, 13 Drawing Sheets

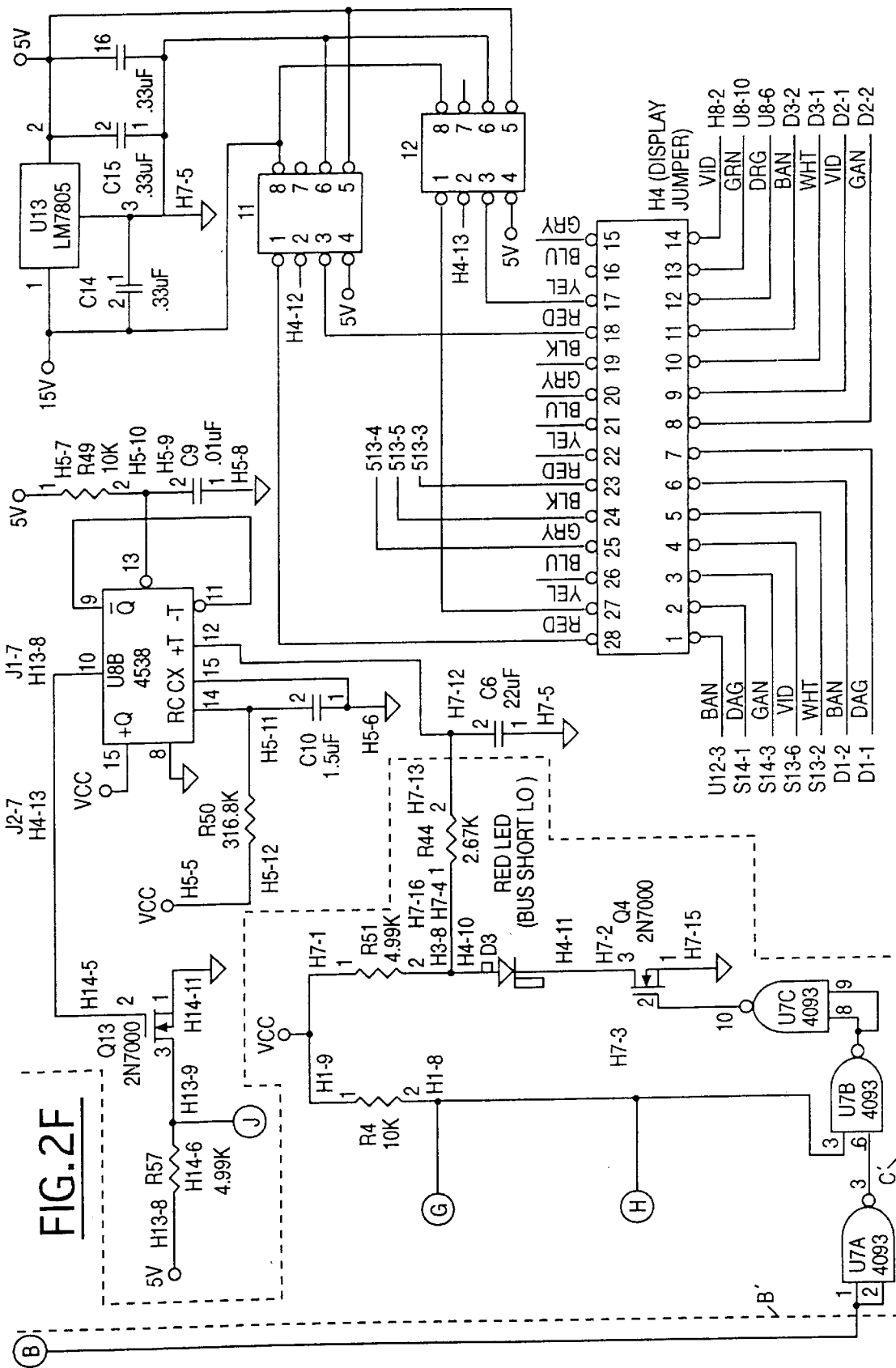

BUS ISOLATION/DIAGNOSTIC TOOL

This application is a U.S. patent application based on U.S. Provisional patent application Ser. No. 60/059,144 filed Sep. 17, 1997, priority to which is claimed.

BACKGROUND

This invention pertains to diagnostic tools used to diagnose faults in automotive vehicle wiring, and more particularly, to a bus isolation/diagnostic tool used to isolate the bus signals from modules connected to a common bus in a control module by common connectors.

Automotive vehicles are increasingly using a wide variety of electronic devices. In many cases, these electronic devices communicate with a central control unit, such as a body controller or engine controller. One increasingly common technique of providing the communication link between electronic devices and the central control unit is the use of a common bus, such as the Society of Society of Automotive Engineers (SAE) J1850 Surface Vehicle Standard entitled Class B Data Communications Network Interface, Revised May, 1994, ("J1850 Bus").

In one implementation using the J1850 Bus, such as the one used in certain motor vehicles manufactured by Chrysler Corporation, various electronic modules are connected to a body controller and communicate with the body controller over a common J1850 Bus. All modules on the J1850 Bus are linked together at a common node internal to the body controller and a separate wire connects each module to the J1850 Bus. These separate wires, along with other wire from the modules, are part of the wiring harness of the motor vehicle and are connected to the body controller using one more common connectors. That is, each wire is connected to a separate pin or terminal in the connector or connectors that attach to a corresponding body controller connector or connectors. In turn, the body controller's connector or connectors have pins that are connected to appropriate inputs and outputs of the body controller's connector. The pins to which the J1850 wires of the various electronic modules are connected all connect to the common J1850 bus on the body controller.

The disadvantage that the foregoing arrangement has is that the J1850 connection for the individual electronic modules cannot be individually connected to and disconnected from the body controller at the body controller. Rather, any such individual connections and disconnections must be done at each electronic module. This presents a problem in diagnosing faults in the J1850 communication circuits in the individual electronic modules. Since the J1850 bus is a common bus, if the J1850 circuit of an electronic module fails in a manner that its output is always high (such as shorted to voltage) or low (such as shorted to ground) the J1850 bus will be forced high or low. Therefore, to diagnose such a fault in an individual module, it is often necessary to disconnect and reconnect the electronic modules from the J1850 bus to isolate and identify the electronic module having the fault. This proves to be a cumbersome process as the disconnections and connections must be made at each of the individual electronic modules rather than at the body controller due to the fact that the wiring harness has a common connector or connectors at which all the J1850 circuits terminate. Moreover, connections from the electronic modules to the body controller must often be maintained during the diagnostic process.

It is an object of this invention of alleviating the foregoing cumbersome by providing a bus isolation/diagnostic tool that allows electronic modules to be selectively connected to the common bus in the central controller and that allows connections to the central controller made by the common connector(s) to be maintained.

It is also an object of this invention to provide a bus isolation/diagnostic tool that determines whether a bus communication circuit in an electronic module fails high or low, or is within a specified range, and to accumulate high and low failures of the bus communication circuits of the electronic modules.

SUMMARY OF THE INVENTION

A communication bus test tool for motor vehicles having a plurality of electronic modules connected to a common communication bus in a body controller by a wiring harness. The wiring harness has an individual bus signal wire for the bus signal for each electronic module and at least one connector for connecting to a corresponding connector of the body controller. The wiring harness's connector has an individual terminal connected to each individual bus signal wire and the body controller's connector has terminals corresponding to the wiring harness' connector terminals. The bus test tool has a first connector for connecting to the wiring harness's connector with individual terminals corresponding to the individual terminals in the wiring harness connector including individual bus terminals corresponding to the terminals in the wiring harness connector connected to the bus signal wires. The bus test tool has a second connector for connecting to the body controller's connector with individual terminals corresponding to the individual terminals in the bus test tool's first connector including individual bus terminals corresponding to the individual bus terminals in the first connector. Circuits are coupled between the bus test tool's first and second connectors for selectively connecting and disconnecting the bus terminals in the first connector to the corresponding bus terminals connections in the second connector to permit bus signals from each electronic module to be selectively isolated from the common bus in the body controller. The bus test tools also includes circuits for detecting whether the bus signal from an electronic module is above a specified operating range, within the range, or below the range, and indicating the results of the detection.

BRIEF DESCRIPTION OF THE DRAWINGS

Additional features and advantages of the invention will become apparent to those skilled in the art upon consideration of the following detailed description of a preferred embodiment exemplifying the best mode of carrying out the invention as presently perceived. The detailed description particularly refers to the accompanying figures in which.

DETAILED DESCRIPTION

Figure 1:
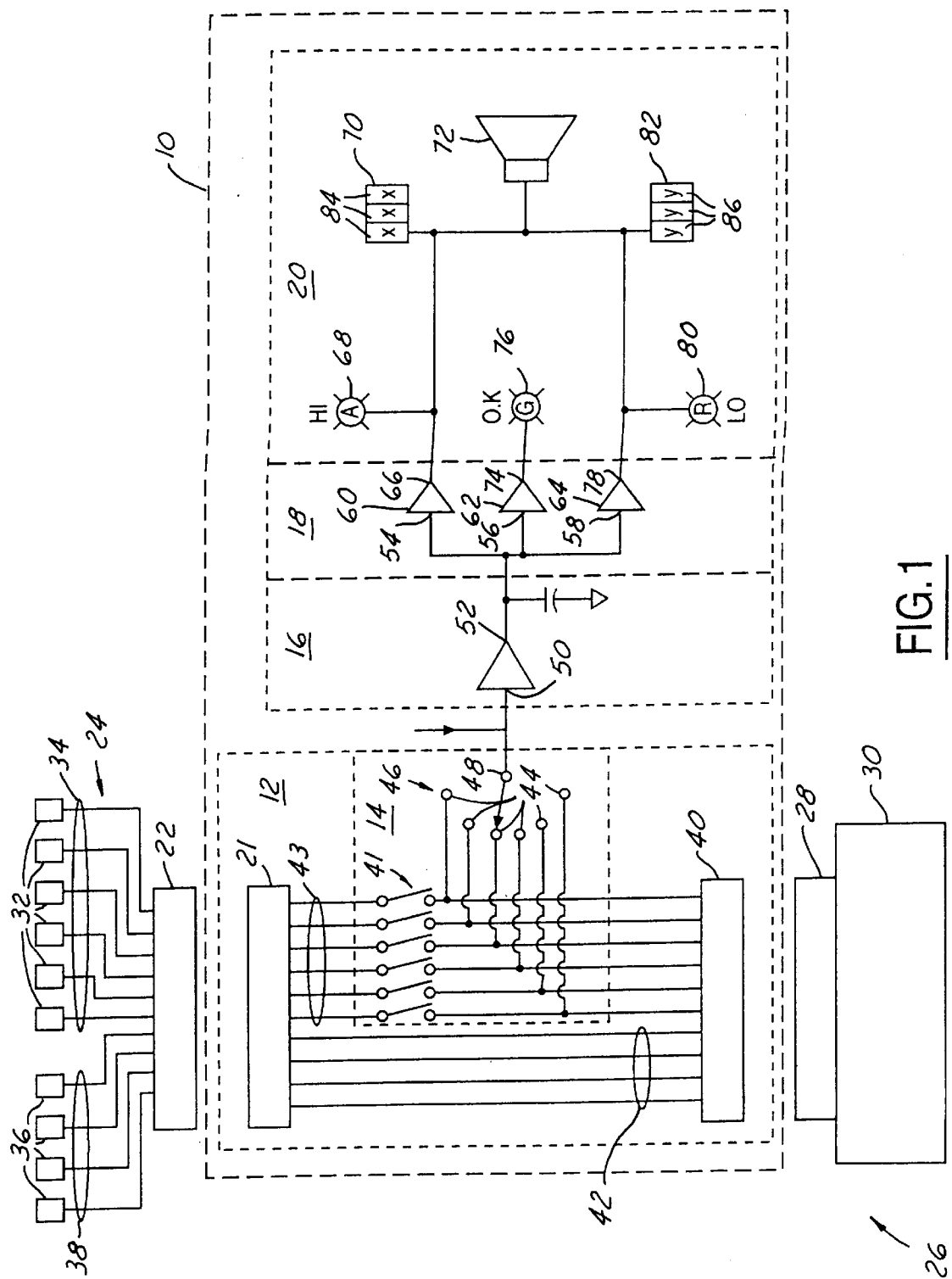
FIG. 1 is a block diagram of a bus isolation/diagnostic tool according to this invention.
Figure 2A:
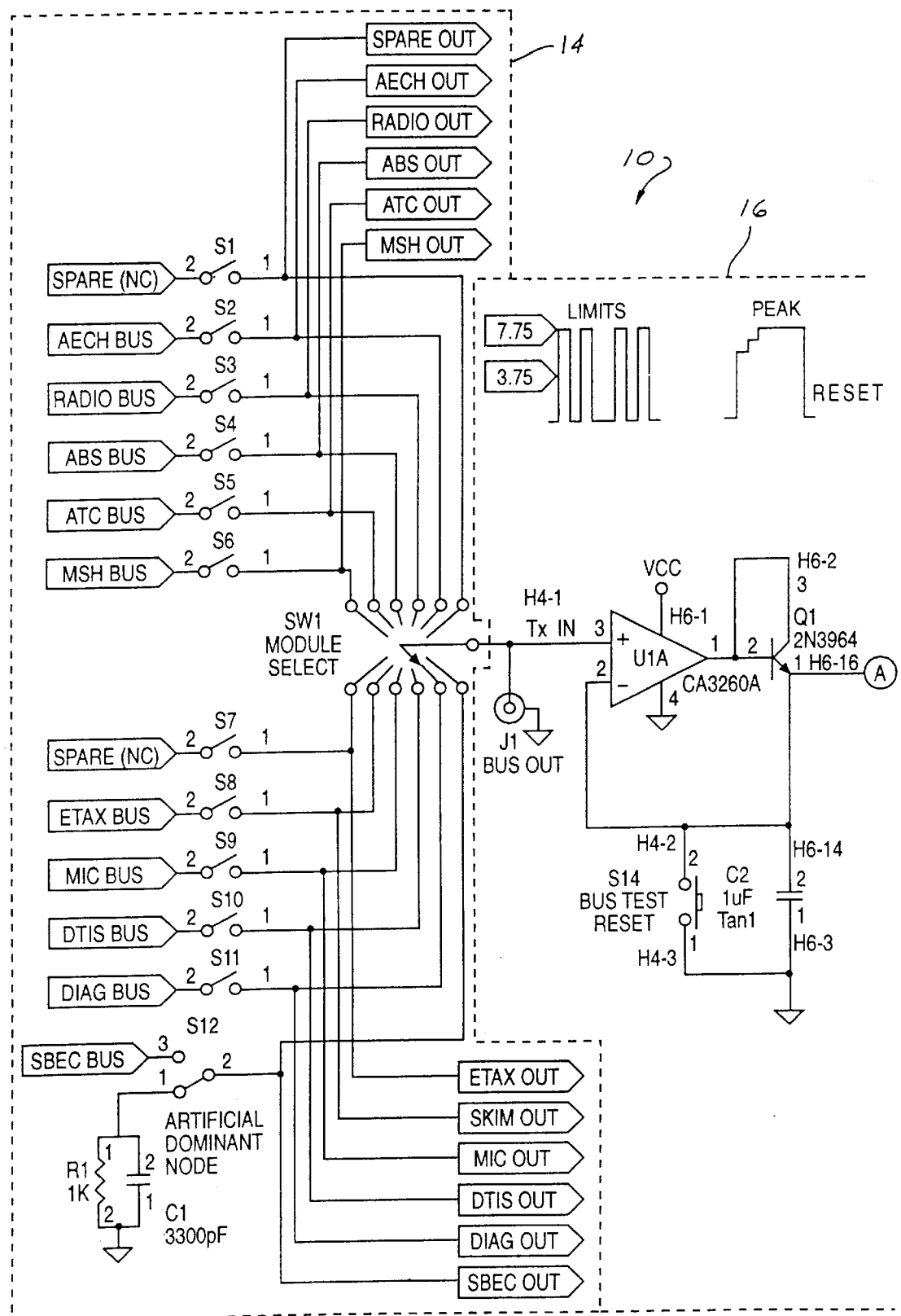
FIG. 2 is a schematic of the bus isolation/diagnostic tool of FIG. 1.
Figure 2B:
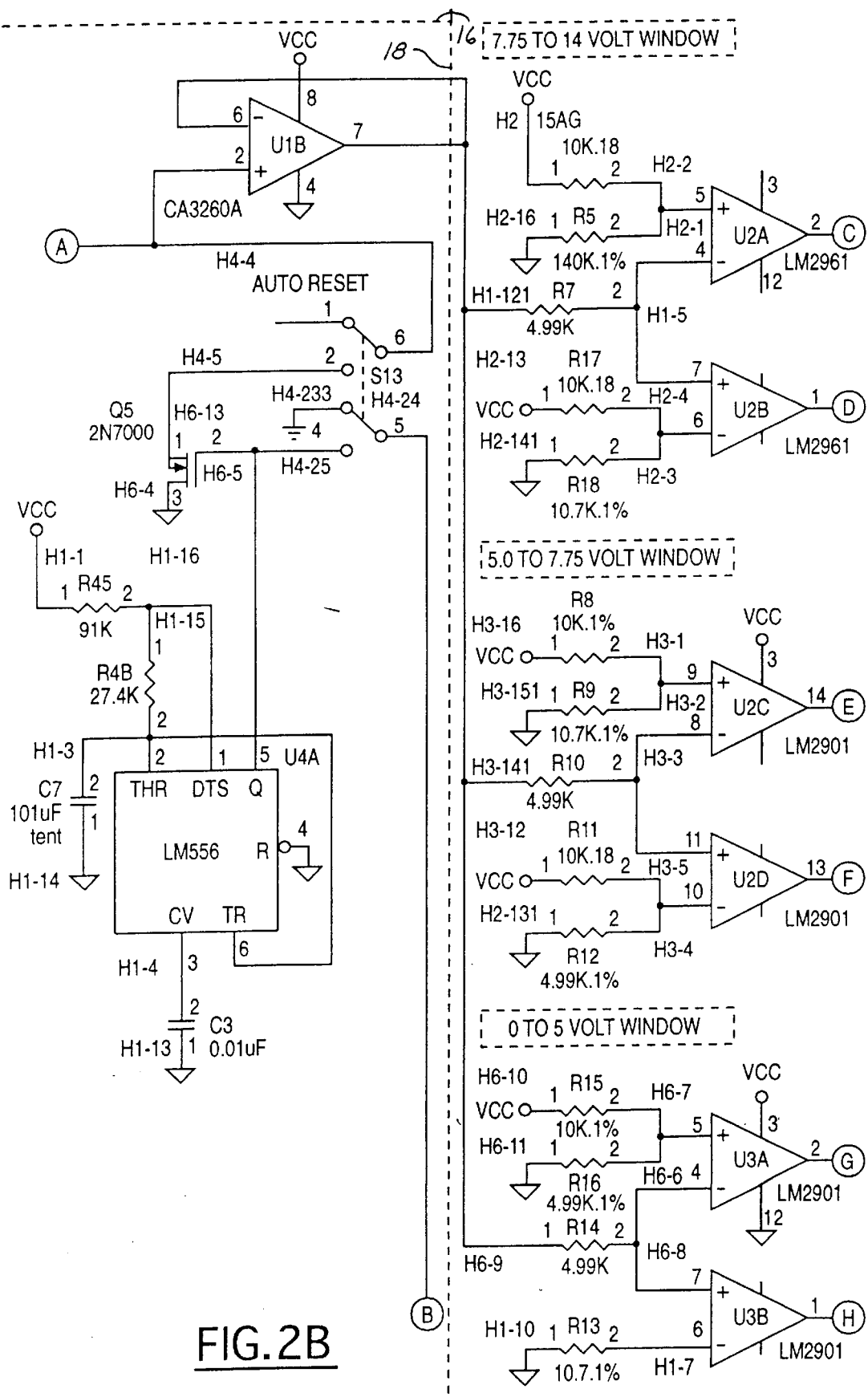
Figure 2C:
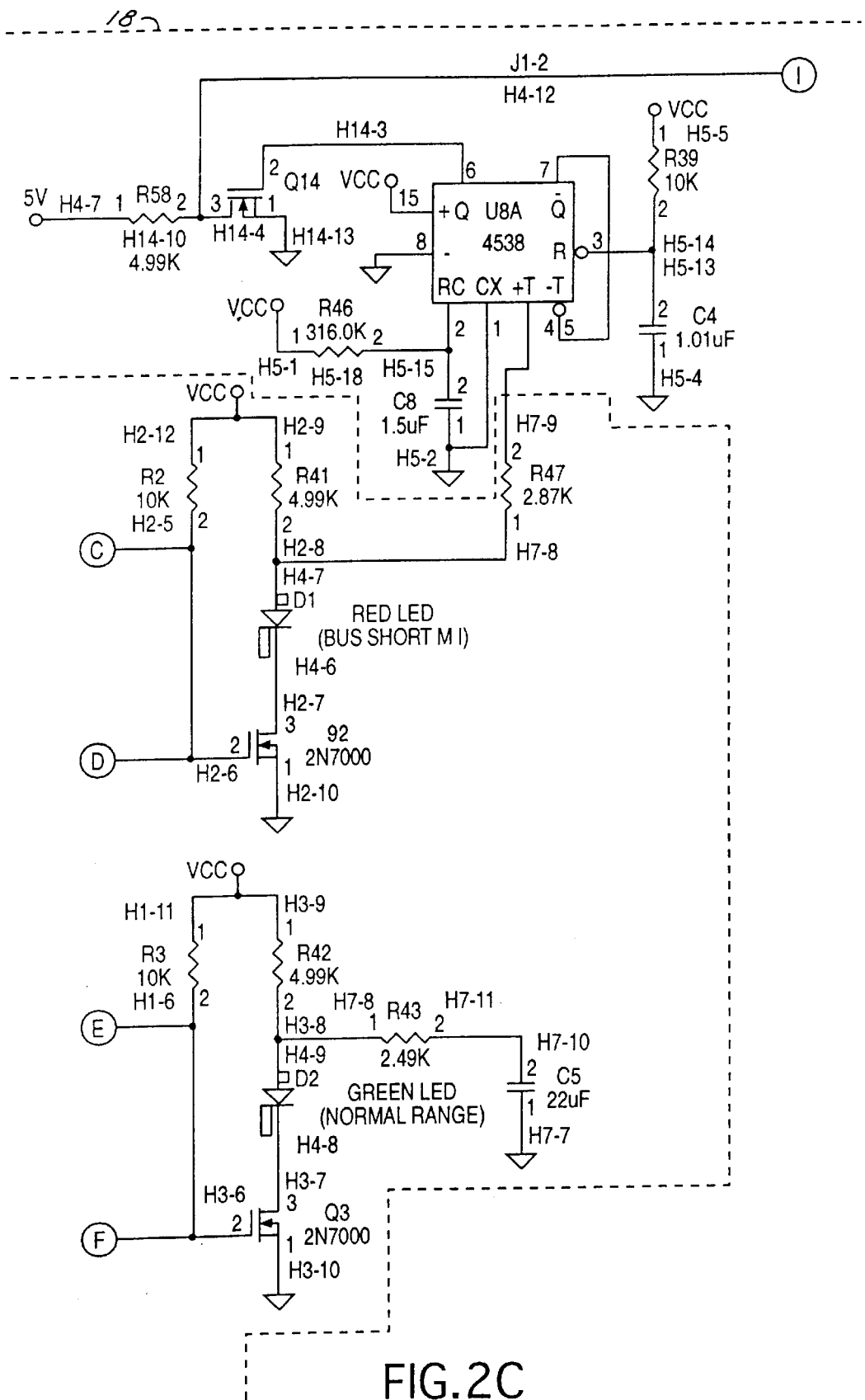
Figure 2D:
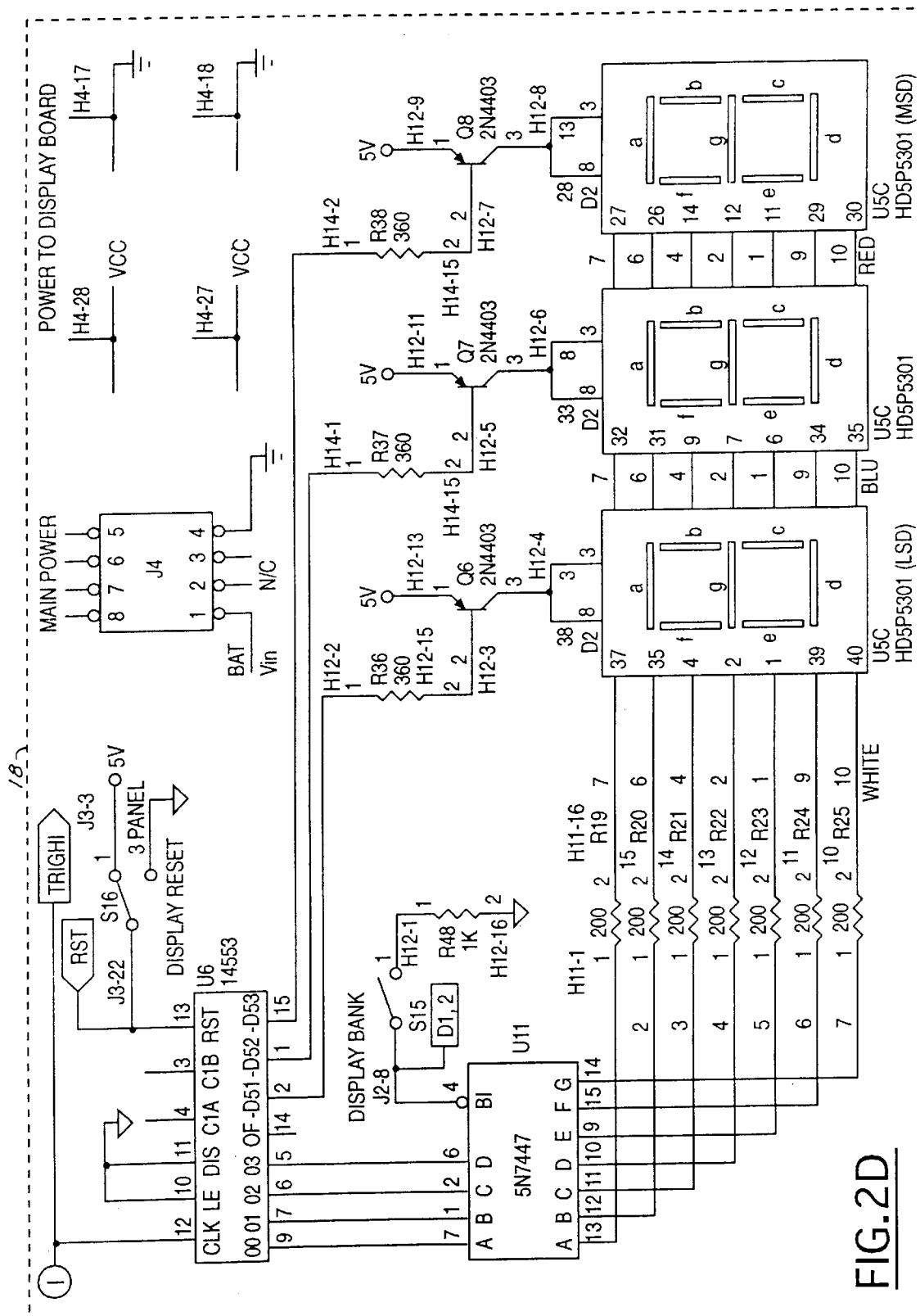
Figure 2E:
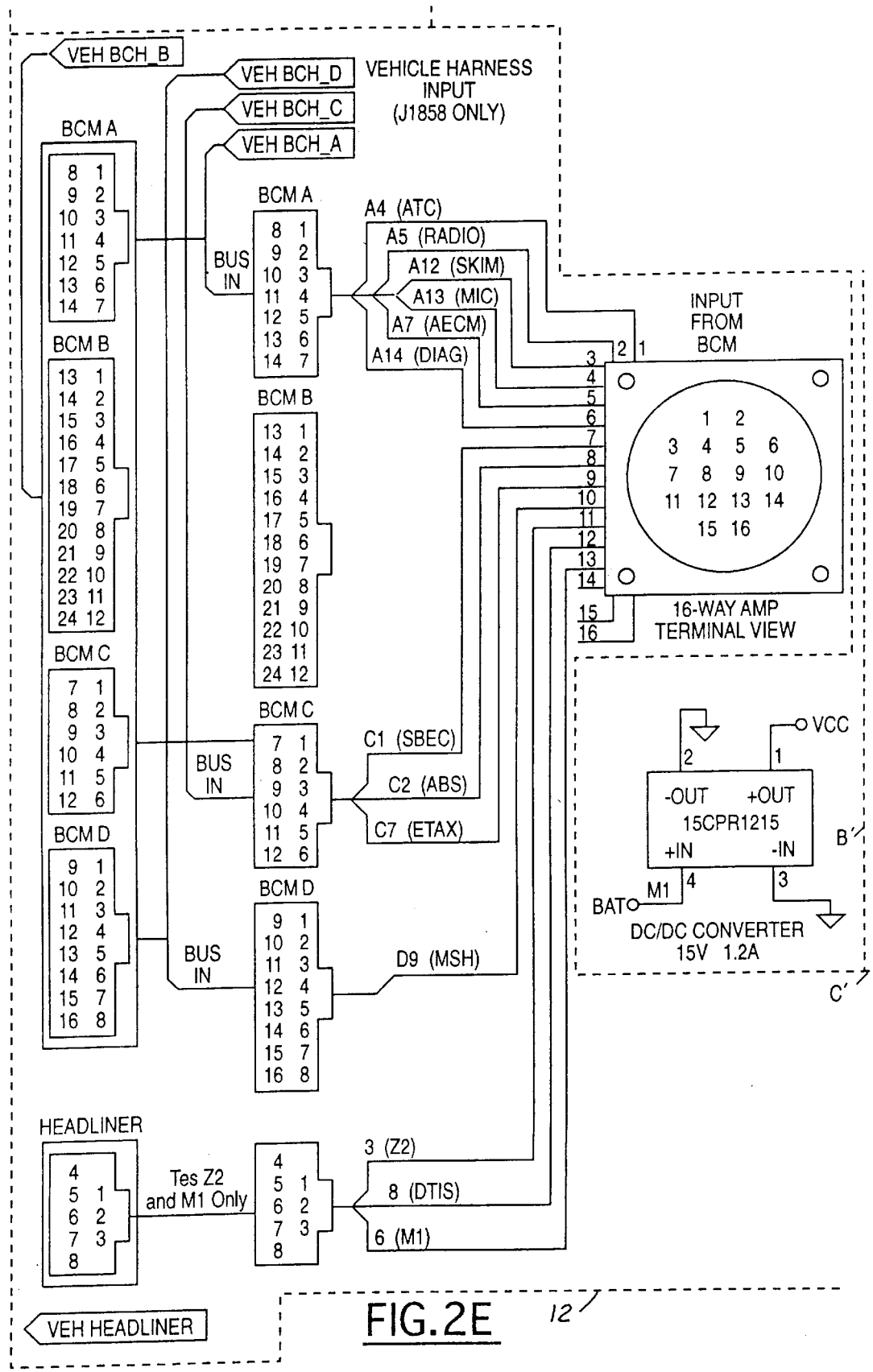
Figure 2G:
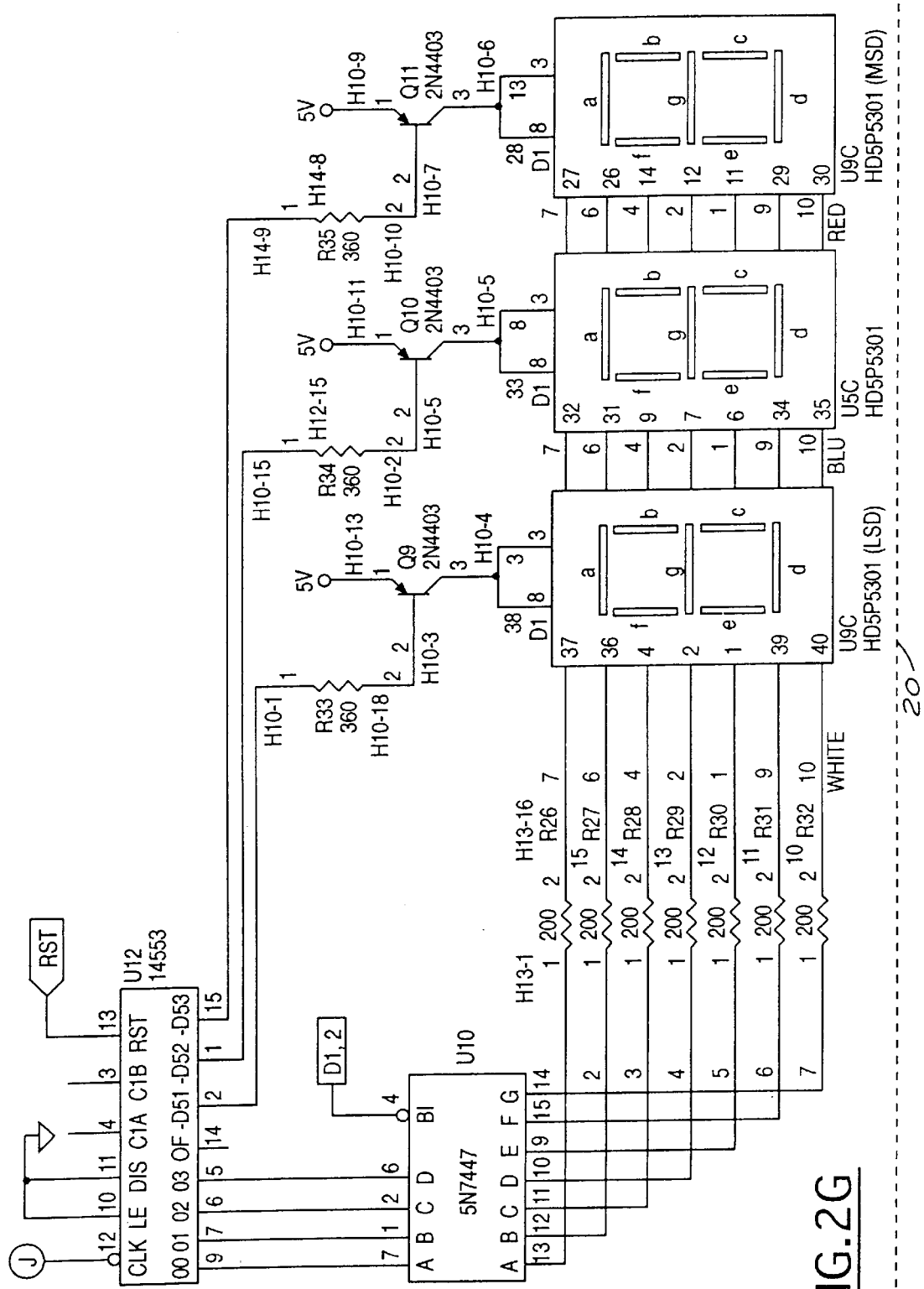
Figure 2H:
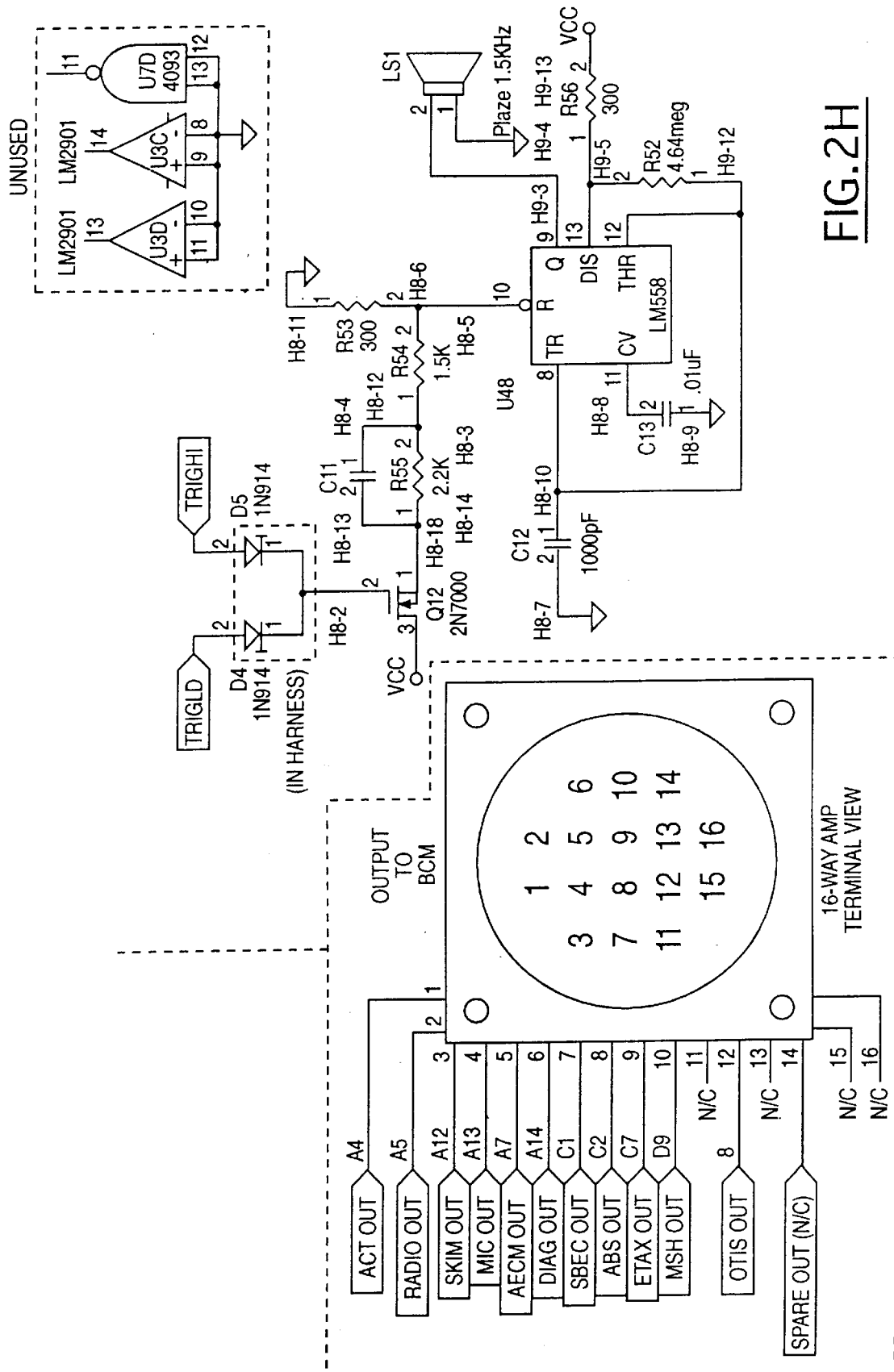
Figure 3A:
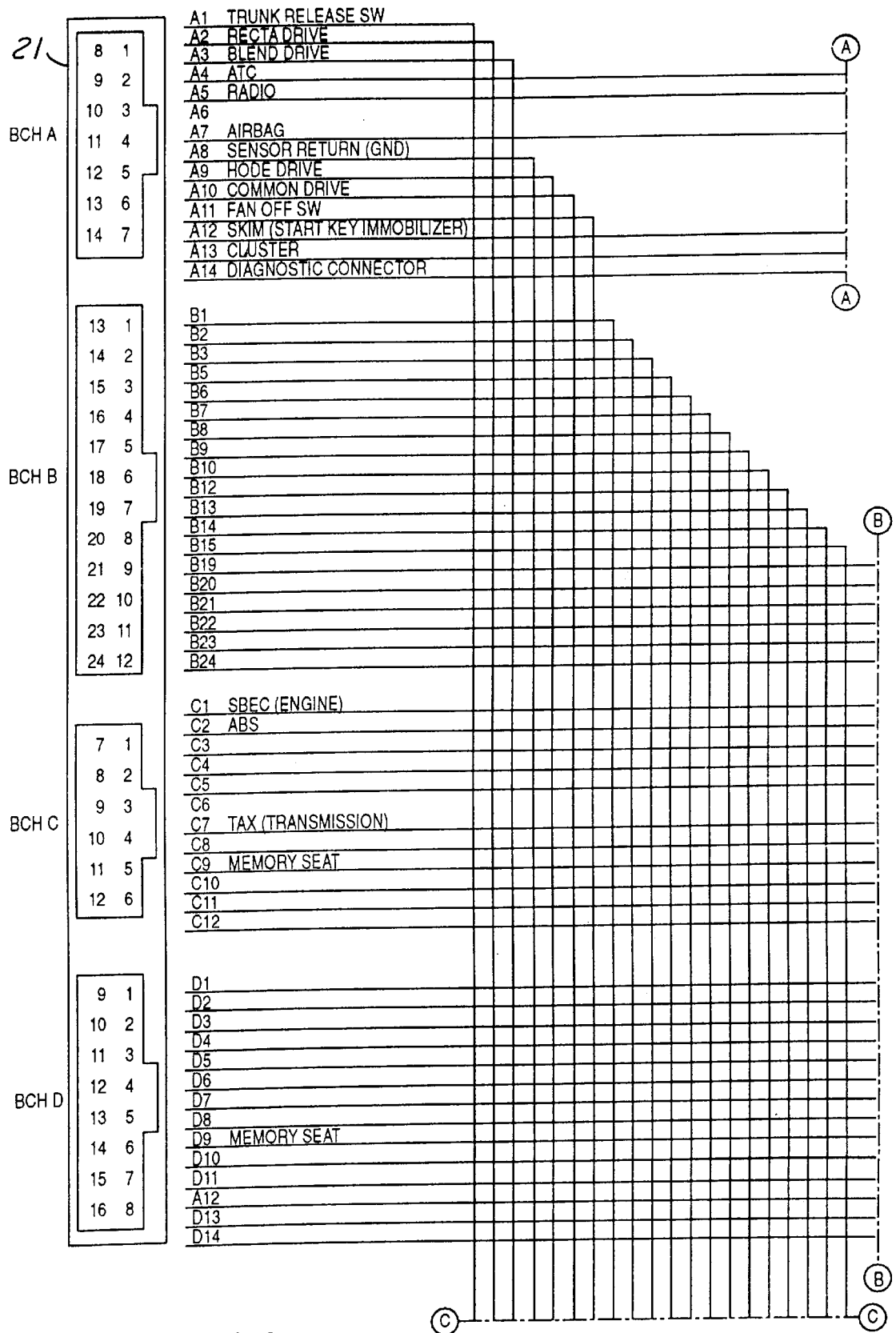
FIG. 3 is a schematic of the input/output portion of the bus isolation/diagnostic tool of FIG. 2.
Figure 3B:
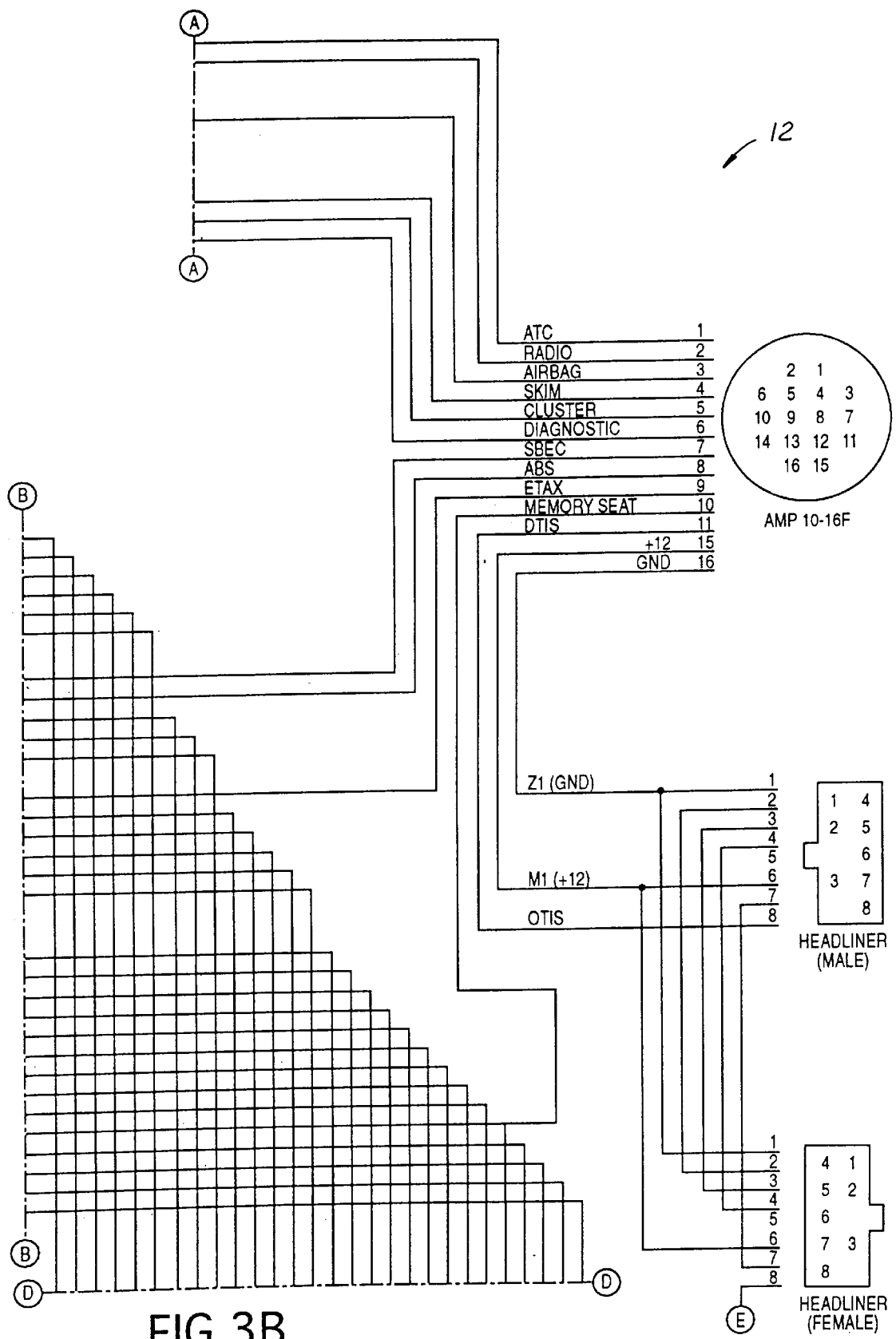
Figure 3C:
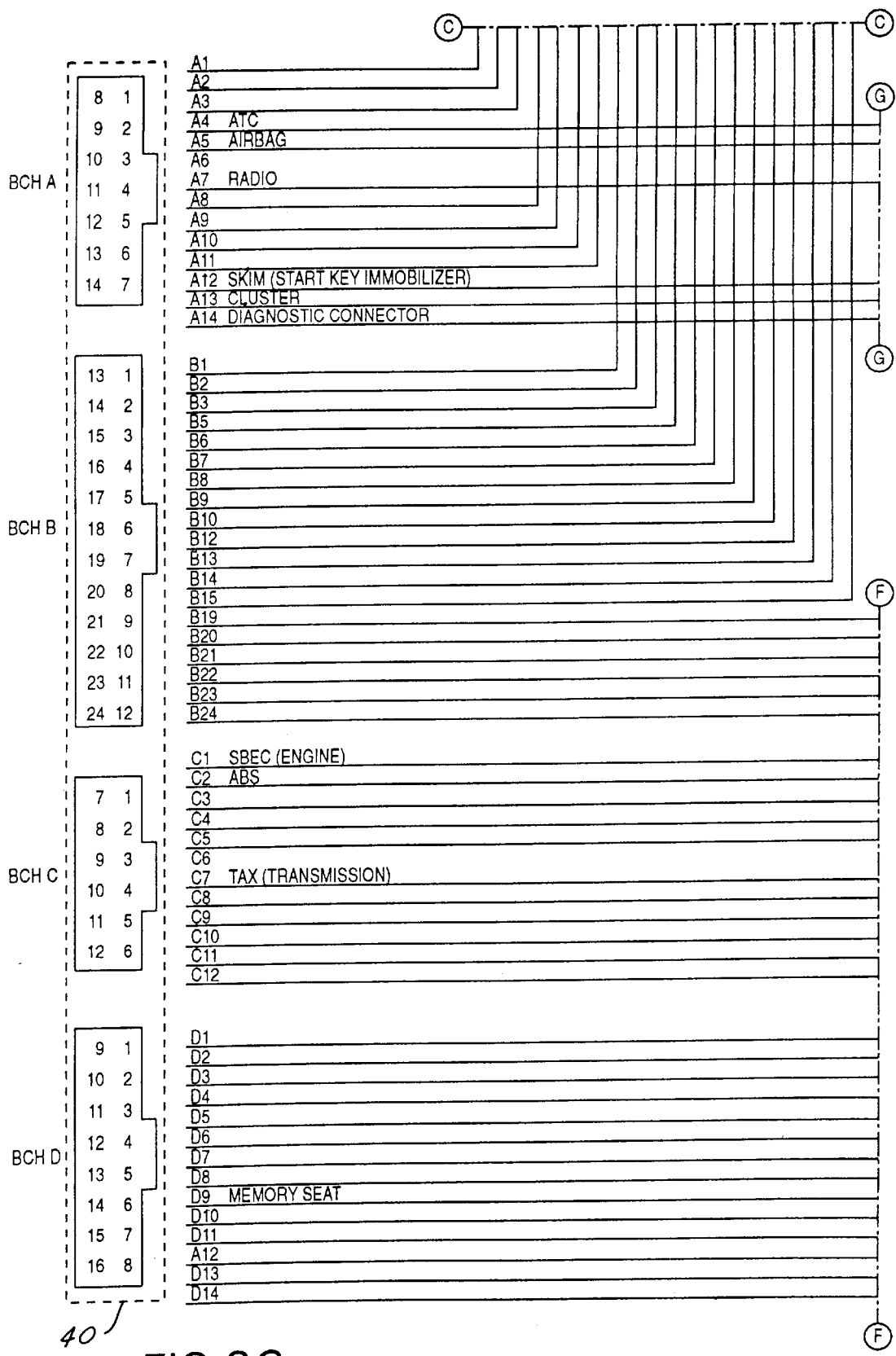
Figure 3D:
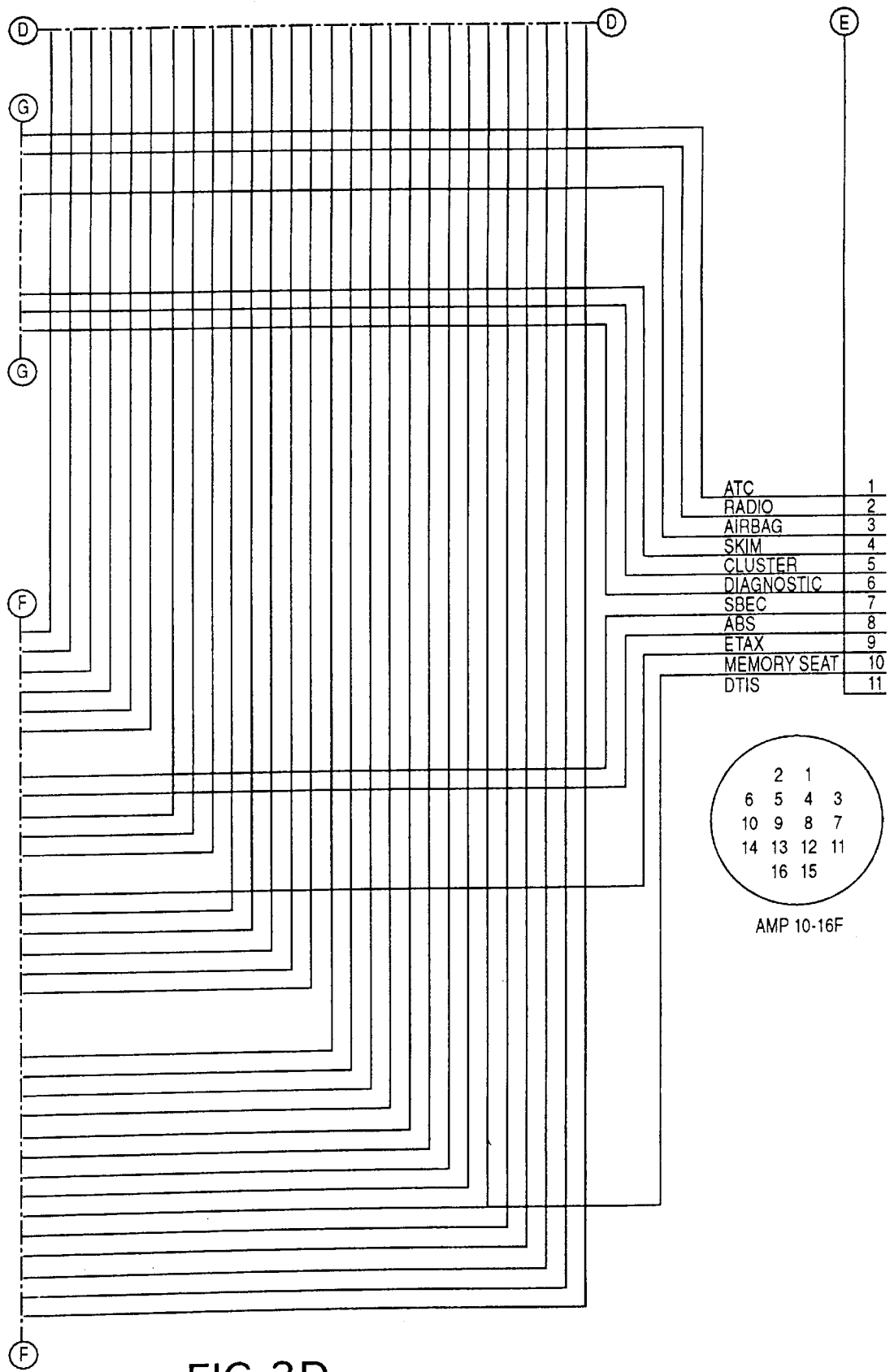

Referring to FIG. 1, a bus test or isolation/diagnostic tool 10 according to this invention has an input/output section 12 coupled to inputs of a module selection section 14. An output of module selection section 14 is coupled to an input of peak detect and hold section 16. An output of peak detect and hold section 16 is coupled to inputs of comparator section 18. Outputs of comparator section 18 are coupled to inputs of indicator section 20.

Input/output section 12 has a connector 21 that connects to a connector 22 of a wiring harness 24 in a motor vehicle 26. Connector 22 is normally coupled to a corresponding connector 28 of the motor vehicle's body controller 30. As representatively shown in FIG. 1, motor vehicle 26 includes a plurality of electronic modules 32 that communicate with body controller 20 using a common communication bus, such as the J1850 bus. In this regard, the common J1850 bus is provided in body controller 30 and a separate wire in wiring harness 24 is used to connect each module 32 to the common communication bus, which wires are shown representatively in FIG. 1 as wires 34. Motor vehicle 26 also has a plurality of electronic devices 36 that are connected to body controller 30 but do not require bus communication. Typically, each such electronic device 36 will be connected to body controller 30 by one or more individual wires in wiring harness 24, shown representatively in FIG. 1 as wires 38.

Input/output section 12 also has a connector 40 for connecting to connector 28 of body controller 30 and wires 42 extending between connector 21 and connector 40 that jumper the non-J1850 connections of wiring harness 24 to body controller 30 when bus isolation/diagnostic tool 10 is connected for use. The J1850 connections from wiring harness 24 of modules 32, shown representatively by 43 in FIG. 1, are connected through individual switches 41 to inputs of module selection section 14 of bus isolation/diagnostic tool 10, which inputs are preferably individual contacts 44 of a selector switch 46 of module selection section 14. An output of module selection section 14, which illustratively comprises a common contact 48 of selector switch 46, is coupled to input 50 of peak detect and hold section 16. Peak detection and hold section 16 illustratively comprises a conventional peak detect and hold circuit that captures the peak voltage of a signal provided to it and holds it for a period of time.

An output 52 of peak detect and hold section 16 is coupled to inputs 54, 56, 58 of comparators 60, 62, 64 of comparator section 18. Comparators 60, 62, 64 are illustratively conventional window comparators with comparator 60 configured to detect a high fault condition of the electronic module 32 bus communication circuit being tested, window comparator 62 configured to detect an in-range condition of the electronic module 32 bus communication circuit being tested, and window comparator 64 configured to detect a low fault condition of the electronic module 32 bus communication circuit being tested For testing J1850 communication circuits, window comparator 60 is configured to detect a voltage range of 7.75 V to 14 V, window comparator 62 is configured to detect a voltage range of 5.8 V to 7.75 V, and window comparator 64 is configured to detect a 0 V to 5.8 V range.

An output 66 of comparator 60 is coupled to a visual indicator 68 of indicator section 20, to an input of a counter 70, and to an audible indicator 72. An output 74 of comparator 62 is coupled to a visual indicator 76 of indicator section 20. An output 78 of comparator 64 is coupled to a visual indicator 80 of indicator section 20, to an input of a counter 82 of indicator section 20, and to audible indicator 72. Counters 70, 82 illustratively include displays 84, 86, respectively, for displaying their accumulated counts.

In operation, connector 22 of wiring harness 24 is unplugged from connector 28 of body controller 30 and connector 22 then plugged into connector 21 of input/output section 12 of bus isolation/diagnostic tool 10 and connector 40 of input/output section 12 mated with connector 28 of body controller 30. The non-J1850 bus connections, illustrated by wires 42 are routed to connector 40 and connected to body controller 30 through connector 28 of body controller 30. The J1850 connections, illustrated by wires 43, are selectively connected to body controller 30 by switches 41 so that J1850 bus signal from the individual electronic modules 32 can be selectively isolated from the J1850 bus in body controller 30.

The J1850 signal from individual electronic modules 32 additionally can be tested by bus isolation/diagnostic tool 10 to determine whether the signal is within the recommended operating range for J1850 communications (5.8 V to 7.75 V). To do so, rotary switch 46 positioned to select the individual electronic module 32 to be tested and its associated switch 41 is also closed. The J1850 signal from the selected electronic module 32 is captured by peak sample and hold section 16 and the captured signal input to window comparators 60, 62, 64 of comparator section 18. Comparator 60 detects whether the J1850 signal is over-range and if it is, illuminates visual indicator 68 of indicator section 20, energizes audible alarm 72 of indicator section 20, and increments counter 70 of indicator section 20. Comparator 62 detects whether the J1850 signal is within range and if it is, illuminates visual indicator 76. Comparator 64 detects whether the J1850 signal is under range and if it is, illuminates visual indicator 80, energizes audible alarm 72, and increments counter 82.

Bus isolation/diagnostic tool 10 also has test input 88 coupled to common contact 48 of rotary switch 46 of module selection section 14. Test input 88 can be used to inject test signals onto the J1850 Bus connection for the selected electronic module 32, such as noise, so that the reaction of the selected electronic module 32 to the test signal can be determined.

FIG. 2 is a detailed schematic of the bus isolation/diagnostic tool 10 of FIG. 1 constructed for use with the 1998 Model Year LH series motor vehicles manufactured by Chrysler Corporation and FIG. 3 is a detailed schematic of input/output section 12 for the schematic of FIG. 2. Appendix A is a table identifying the components for the schematic of FIG. 2. As shown in FIGS. 2 and 3, input/output section 12 is preferably a cable assembly where the rest of bus isolation/diagnostic tool 10 is mounted in a housing (not shown) which is connected to the vehicle wiring harness 24 and body controller 30 by input/output section 12.

Referring to FIG. 2, peak detect and hold 16 includes reset switch S14 for manually resetting peak detect and hold section 16 and auto reset switch S13 with associated LM556 timer circuit for free running peak detect and hold section 16.

Although the invention has been described in detail with reference to certain preferred embodiments and specific examples, variations and modifications exist within the scope and spirit of the invention as defined in the following claims.

What is claimed is:

1. A communication bus test tool for motor vehicles having a plurality of electronic modules connected to a common communication bus in a body controller by a wiring harness, the wiring harness having an individual bus signal wire for the bus signal for each electronic module and at least one connector for connecting to a corresponding connector of the body controller, the wiring harness's connector having an individual terminal connected to each individual bus signal wire, the body controller's connector having terminals corresponding to the wiring harness' connector terminals, the bus test tool comprising:

a. a first connector for connecting to the wiring harness's connector, the first connector having individual terminals corresponding to the individual terminals in the wiring harness connector including individual bus terminals corresponding to the terminals in the wiring harness connector connected to the bus signal wires;

b. a second connector for connecting to the body controller's connector having individual terminals corresponding to the individual connections in the first connector including individual bus terminals corresponding to the individual bus terminals in the first connector; and c. means coupled between the first and second connectors for selectively connecting and disconnecting the bus terminals in the first connector to the corresponding bus terminals connections in the second connector to permit bus signals from each electronic module to be selectively isolated from the common bus in the body controller.

2. The bus test tool of claim 1 and further including means for detecting whether a bus signal is within a specified range and means coupled to the detection means and to at least one of the first and second connectors for selectively connecting each of the bus terminals in the at least one of the first and second connectors to the detection means.

3. The bus test tool of claim 2 and further including indicating means coupled to the detecting means for indicating whether the bus signal is within range.

4. The bus test tool of claim 2 wherein the detecting means includes a first comparator for determining if the bus signal is over range, a second comparator for determining if the bus signal is within range, and a third comparator for determining if the bus signal is under range, the bus test tool further including a first visual indicator coupled to the first comparator and being illuminated when the first comparator determines that the bus signal is over range, a second visual indicator coupled to the second comparator and being illuminated when the second comparator determines that the bus signal is within range, and a third visual indicator coupled to the third comparator and being illuminated when the third comparator determines that the bus signal is under range.

5. The bus test tool of claim 1 wherein the means for selectively connecting and disconnecting the bus terminals in the first connector to the corresponding bus terminals in the second connector includes a switch connected between each set of corresponding bus terminals in the first and second connectors.

6. The bus test tool of claim 2 wherein the means for selectively connecting and disconnecting the bus terminals in the first connector to the corresponding bus terminals in the second connector includes a switch connected between each set of corresponding bus terminals in the first and second connectors, the means for selectively connecting the bus terminals in the at least one of the first and second connectors to the detection means includes a rotary switch having individual terminals connected to the individual bus terminals of the at least one of the first and second connectors and a common terminal connected to the detection means.

7. The bus test tool of claim 6 and further including a test input coupled to the common terminal of the rotary switch to allow test signals to be injected on the bus signal line of the selected electronic module.

\* \* \* \* \*